US012671394B2

(12) United States Patent
Kim

(10) Patent No.: US 12,671,394 B2
(45) Date of Patent: Jun. 30, 2026

(54) FREQUENCY GENERATOR AND FREQUENCY CORRECTION METHOD FOR FREQUENCY GENERATOR

(71) Applicant: LX SEMICON CO., LTD., Daegu (KR)

(72) Inventor: Hyeong Seok Kim, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 18/722,380

(22) PCT Filed: Dec. 15, 2022

(86) PCT No.: PCT/KR2022/020445
§ 371 (c)(1),
(2) Date: Jun. 20, 2024

(87) PCT Pub. No.: WO2023/121140
PCT Pub. Date: Jun. 29, 2023

(65) Prior Publication Data
US 2024/0421802 A1 Dec. 19, 2024

(30) Foreign Application Priority Data
Dec. 21, 2021 (KR) ........................ 10-2021-0183841

(51) Int. Cl.
*H03K 3/01* (2006.01)
*G06F 1/08* (2006.01)
(Continued)

(52) U.S. Cl.
CPC .............. *H03K 3/011* (2013.01); *G06F 1/08* (2013.01); *H03K 3/014* (2013.01); *G09G 3/2003* (2013.01); *G09G 2310/0291* (2013.01)

(58) Field of Classification Search
CPC .......... H03K 3/011; H03K 3/014; G06F 1/08
See application file for complete search history.

(56) References Cited

U.S. PATENT DOCUMENTS 7,898,343 B1 * 3/2011 Janesch ................. H03L 7/1974
331/25
8,219,345 B2 7/2012 Haartsen et al.
(Continued)

FOREIGN PATENT DOCUMENTS

JP 2003-219202 A 7/2003
JP 2008-015006 A 1/2008
(Continued)

OTHER PUBLICATIONS

Extended European Search Report dated Oct. 13, 2025 issued in Patent Application No. 22911773.4 (11 pages).
(Continued)

*Primary Examiner* — Daniel C Puentes
(74) *Attorney, Agent, or Firm* — Polsinelli PC

(57) ABSTRACT

A frequency generator and a frequency correction method for a frequency generator, which have the purpose to provide a frequency correction technology that actively responds to continuous frequency fluctuations of a clock signal through a frequency measurement period of at least two unit periods. The frequency generator comprises: an oscillator which generates an oscillator clock signal; and a frequency correction circuit which selectively operates in one of a normal mode and a fast mode, which have different correction periods according to the state of the oscillator clock signal.

18 Claims, 10 Drawing Sheets

*150*

(51) Int. Cl.
    *H03K 3/011*     (2006.01)
    *H03K 3/014*     (2006.01)
    *G09G 3/20*     (2006.01)

(56)           References Cited

U.S. PATENT DOCUMENTS

| | | |
|---|---|---|
| 8,648,626 B2 | 2/2014 | Lin |
| 9,466,263 B2 | 10/2016 | Bae et al. |
| 2008/0001896 A1 | 1/2008 | Okamura |
| 2008/0024230 A1* | 1/2008 | Pera ........................ H03L 7/095 |
| | | 331/16 |
| 2008/0158179 A1 | 7/2008 | Wilson |
| 2019/0173457 A1 | 6/2019 | Huang et al. |
| 2021/0191451 A1 | 6/2021 | Gajda et al. |

FOREIGN PATENT DOCUMENTS

| | | |
|---|---|---|
| JP | 4365297 B2 | 11/2009 |
| KR | 10-2005-0035587 A | 4/2005 |
| KR | 10-2011-0020277 A | 3/2011 |
| KR | 10-2013-0133357 A | 12/2013 |
| KR | 10-2014-0145338 A | 12/2014 |

OTHER PUBLICATIONS

Korean Office Action dated Mar. 5, 2026 issued in Patent Application No. KR 10-2021-0183841 (5 pages).

* cited by examiner

Figure 4:
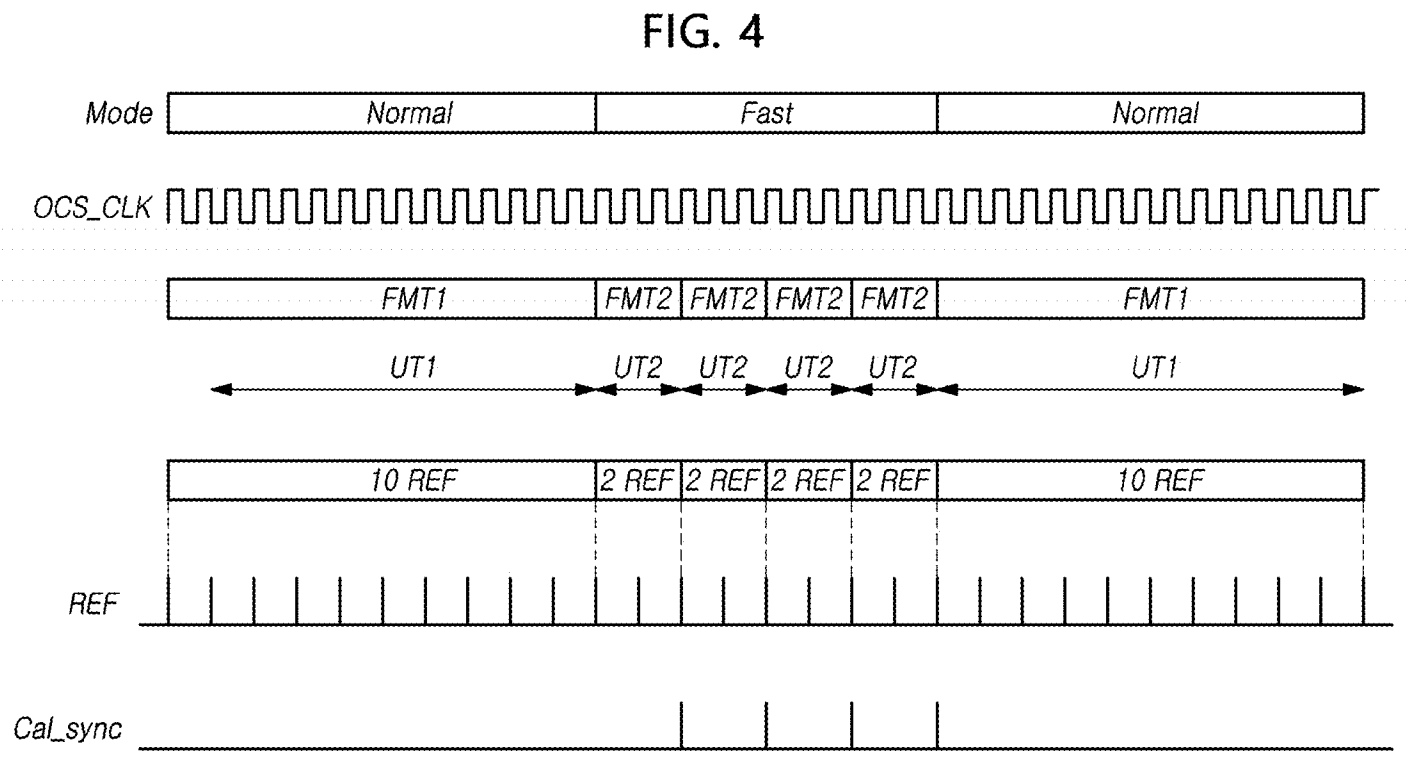

| Mode | Normal | Fast | Normal |
| --- | --- | --- | --- |

OCS_CLK

| FMT1 | FMT2 | FMT2 | FMT2 | FMT1 |

| UT1 | UT2 | UT2 | UT2 | UT2 | UT1 |

| 10 REF | 2 REF | 2 REF | 2 REF | 2 REF | 10 REF |

REF

Cal_sync

| State | Fast | Noise | Stable |
|---|---|---|---|

TA          TB

| Mode | Normal | Fast | Normal |
|---|---|---|---|

FREQUENCY GENERATOR AND FREQUENCY CORRECTION METHOD FOR FREQUENCY GENERATOR

CROSS-REFERENCE TO RELATED APPLICATIONS

This application is a national phase entry of PCT International Application No. PCT/KR2022/020445 filed on Dec. 15, 2022, which claims the priority of Korean Application No. 10-2021-0183841, filed on Dec. 21, 2021, which are hereby incorporated by reference in their entirety.

BACKGROUND

Field of the Disclosure

The present disclosure relates to a frequency generator for correcting frequency fluctuations of an oscillator and a frequency correction method for the frequency generator.

Description of the Background

As information technology develops, the market for display devices, which are a medium for connecting users and information, is growing. Accordingly, the use of display devices such as organic light emitting displays (OLEDs) is increasing.

Such display devices may include a display panel and a display driving circuit that drives the display panel.

In general, the display driving circuit may operate according to a refresh rate, and the refresh rate may be maintained by an oscillator clock signal of a frequency generator included in the display driving circuit.

The frequency of the clock signal may change depending on factors such as the process, voltage, or temperature of an oscillator. When the frequency of the clock signal changes, the image quality of the display device may deteriorate.

Therefore, the display driving circuit has to periodically check and correct frequency fluctuations of the clock signal to quickly improve image quality degradation.

Here, the display driving circuit may receive image data from a host such as an application processor (AP), a central processing unit (CPU), or a graphics processing unit (GPU) included in the display device and may receive, from the host, a vertical synchronization signal, a horizontal synchronization signal, and a data enable signal for displaying the image data on the display panel.

Conventionally, a frequency generator measures a frequency of a clock signal of an oscillator while a reference clock signal of a certain period is repeated a certain number of times, and compensates for frequency fluctuations of the clock signal by comparing the measured frequency of the clock signal with a target frequency.

However, when the frequency of the clock signal is continuously affected by external factors such as wireless charging, the display driving circuit may not actively cope with the frequency fluctuations because the time required to correct the frequency change of the clock signal is constant.

SUMMARY

Accordingly, the present disclosure is to provide a frequency correction technology that actively responds to continuous frequency fluctuations of a clock signal through a frequency measurement period of at least two unit periods.

To achieve the above-described, the present disclosure is to provide a frequency generator including an oscillator that generates an oscillator clock signal; and a frequency correction circuit that selectively operates in one of a normal mode and a fast mode with different correction periods according to a state of the oscillator clock signal.

The frequency generator may measure a frequency of the oscillator clock signal during a first period in the normal mode, may measure the frequency of the oscillator clock signal during a second period shorter than the first period in the fast mode, and may output, to the oscillator, an adjustment signal for correcting a frequency deviation between the measured frequency of the oscillator clock signal and a target frequency.

When the frequency deviation occurs in the normal mode, the frequency correction circuit may correct the frequency of the oscillator clock signal during a preset interval and then start measuring a new frequency, and when the frequency deviation occurs in the fast mode, the frequency correction circuit may correct the frequency of the oscillator clock signal without the interval.

The first period may be a period in which a reference clock signal input from an outside is toggled by a first count, and the second period may be a period in which the reference clock signal is toggled by a second count smaller than the first count.

In another aspect, the present aspect provides a frequency correction method for correcting a frequency of an oscillator in a frequency generator, the frequency correction method including generating an oscillator clock signal; and measuring a frequency of the oscillator clock signal in one of a normal mode and a fast mode with different correction periods according to a state of the oscillator clock signal.

In the method, the measuring of the frequency of the oscillator clock signal may include measuring the frequency of the oscillator clock signal during a first period in the normal mode, and measuring the frequency of the oscillator clock signal during a second period shorter than the first period in the fast mode.

The method may further include outputting an adjustment signal for correcting a frequency deviation between the measured frequency of the oscillator clock signal and a target frequency, wherein the outputting of the adjustment signal may include outputting the adjustment signal for correcting the frequency of the oscillator clock signal during a preset interval in the normal mode, and outputting the adjustment signal for correcting the frequency of the oscillator clock signal without the interval in the fast mode.

As described above, according to the present aspect, a frequency generator, which actively responds to continuous frequency fluctuations of a clock signal through a frequency measurement period of at least two unit periods, and a frequency correction method for the frequency generator may be provided.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

3

Figure 1:
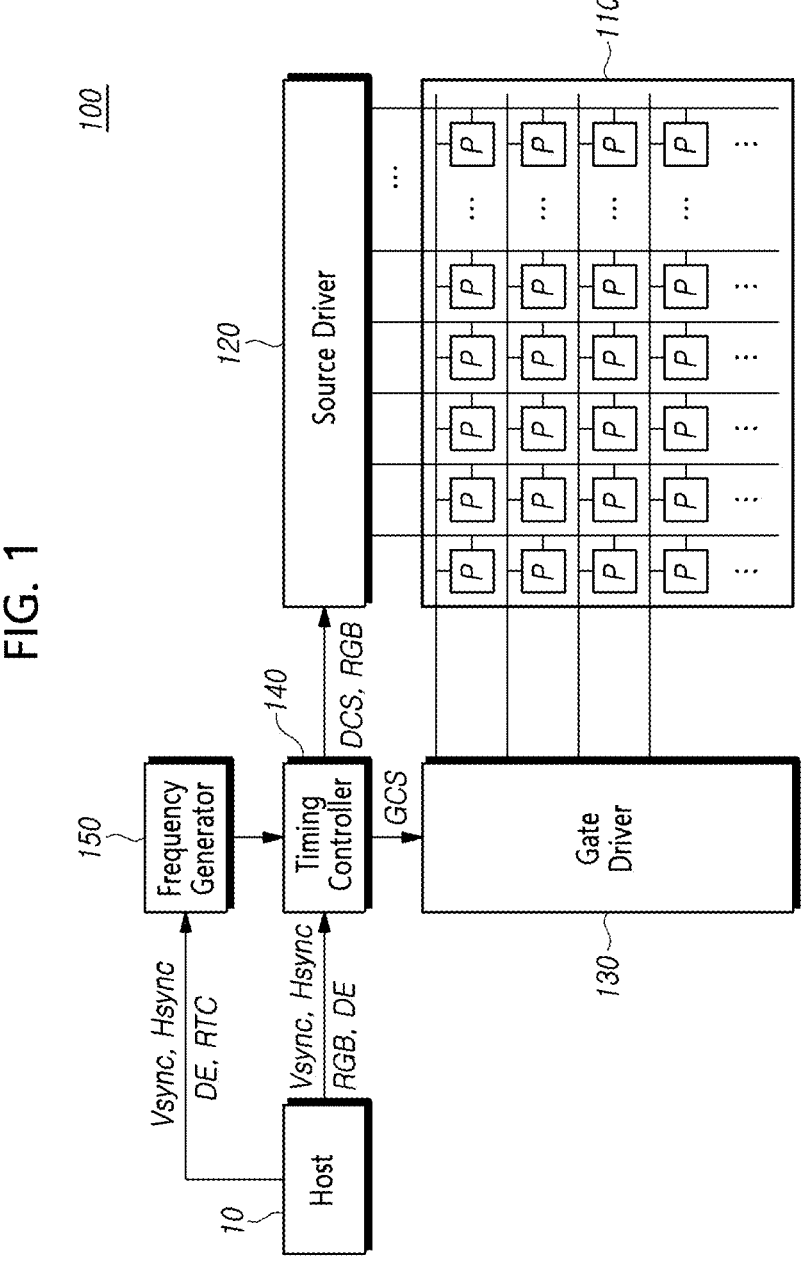

In the drawings:

FIG. 1 is a configuration diagram of a display device according to an aspect of the present disclosure.

Figure 2:
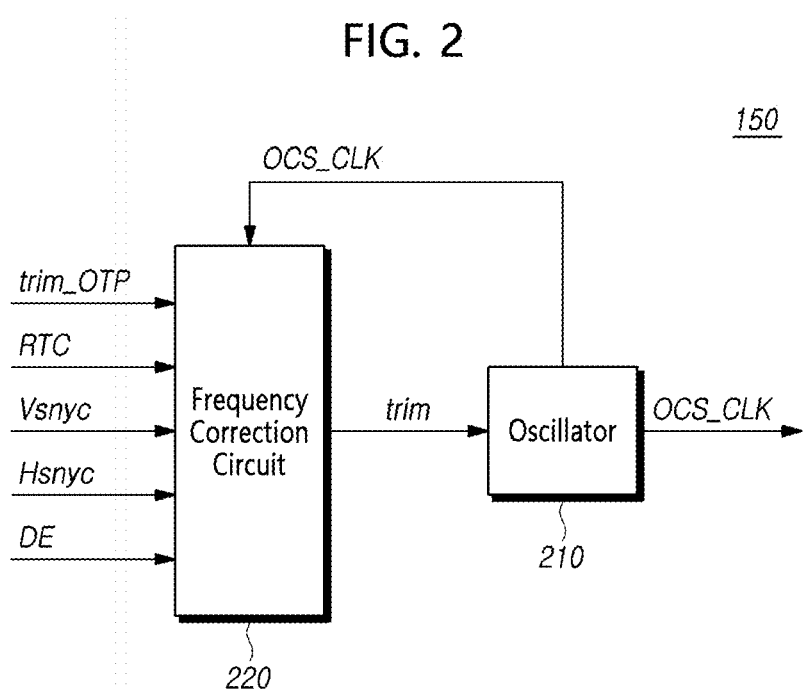

FIG. 2 is a diagram illustrating a frequency generator according to an aspect of the present disclosure.

Figure 3:
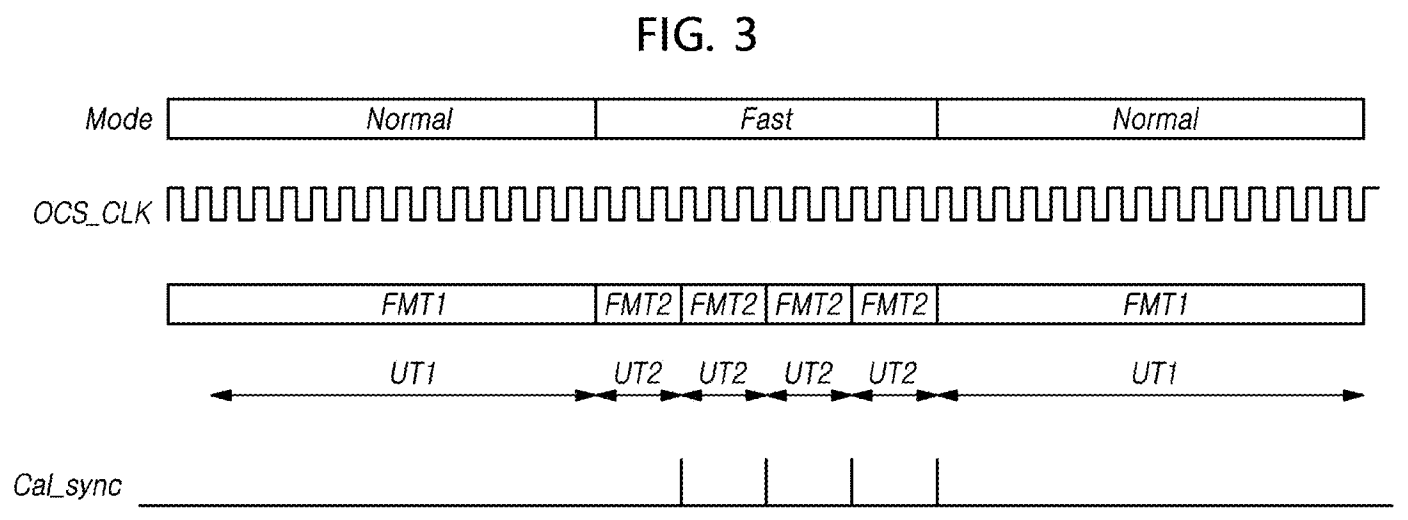

FIG. 3 is a diagram for describing a frequency measurement period and frequency correction for each mode according to an aspect of the present disclosure.

FIG. 4 is a diagram for describing a first unit period and a second unit period according to an aspect of the present disclosure.

Figure 5:
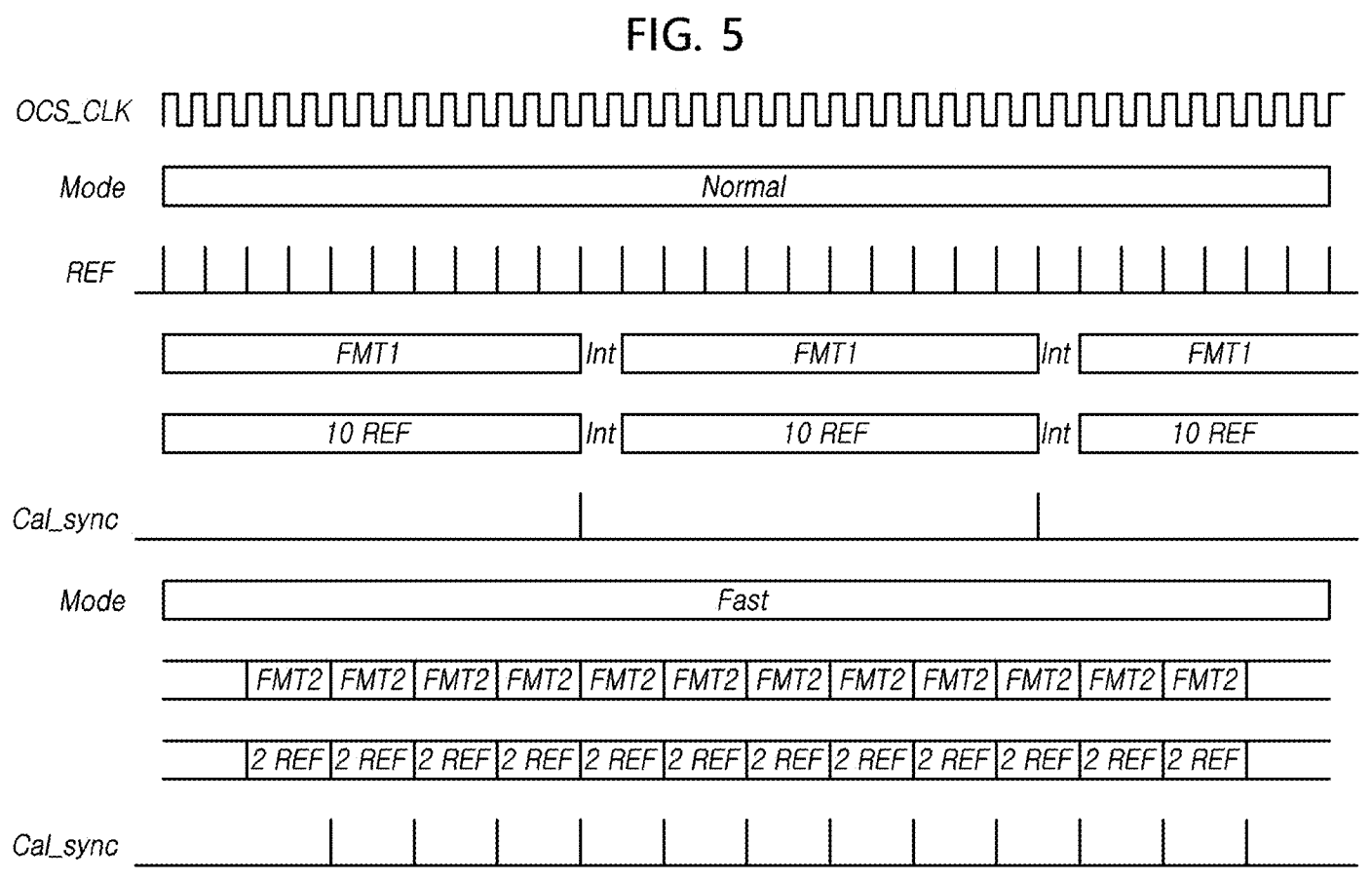

FIG. 5 is a diagram for describing a frequency correction timing for each mode according to an aspect of the present disclosure.

Figure 6:
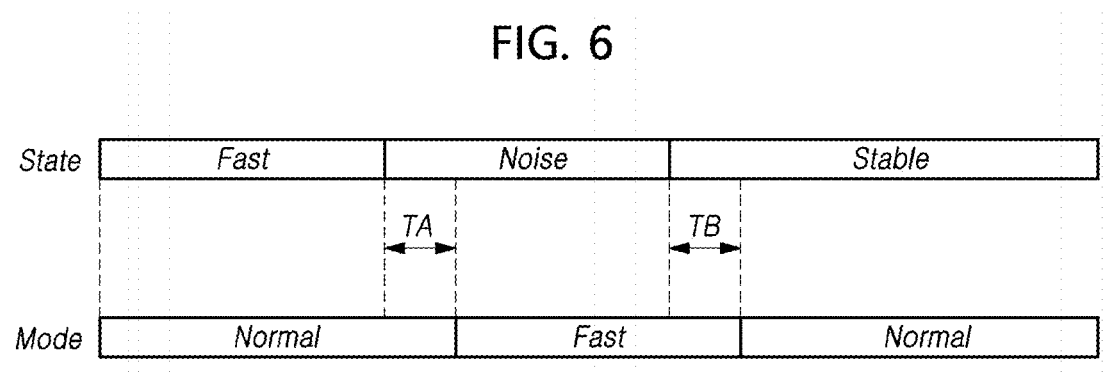

FIG. 6 is a diagram for describing switching between respective modes according to an aspect of the present disclosure.

Figure 7:
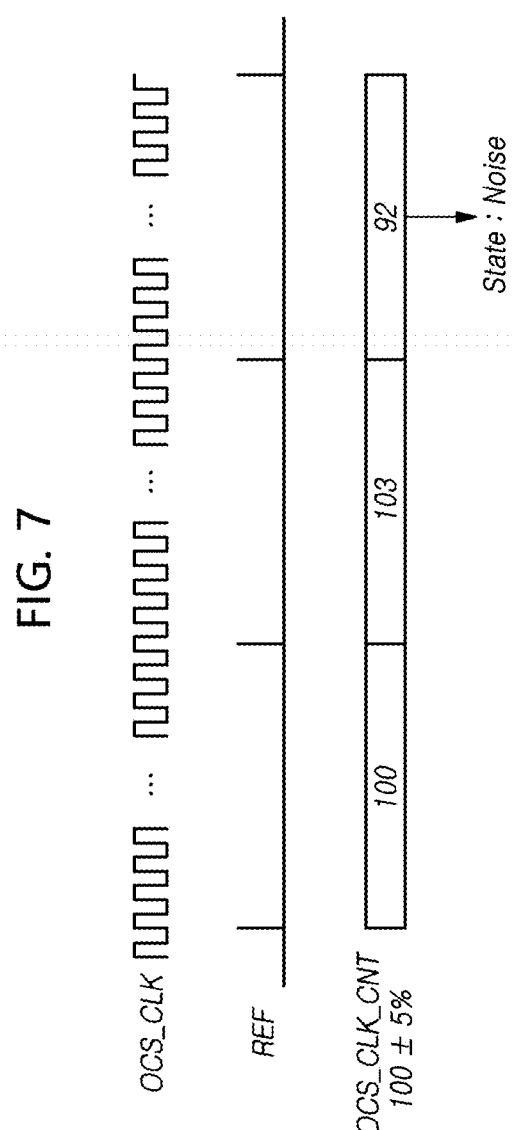

FIG. 7 is a diagram for describing determination as to the presence or absence of a noise effect according to an aspect of the present disclosure.

Figure 8:
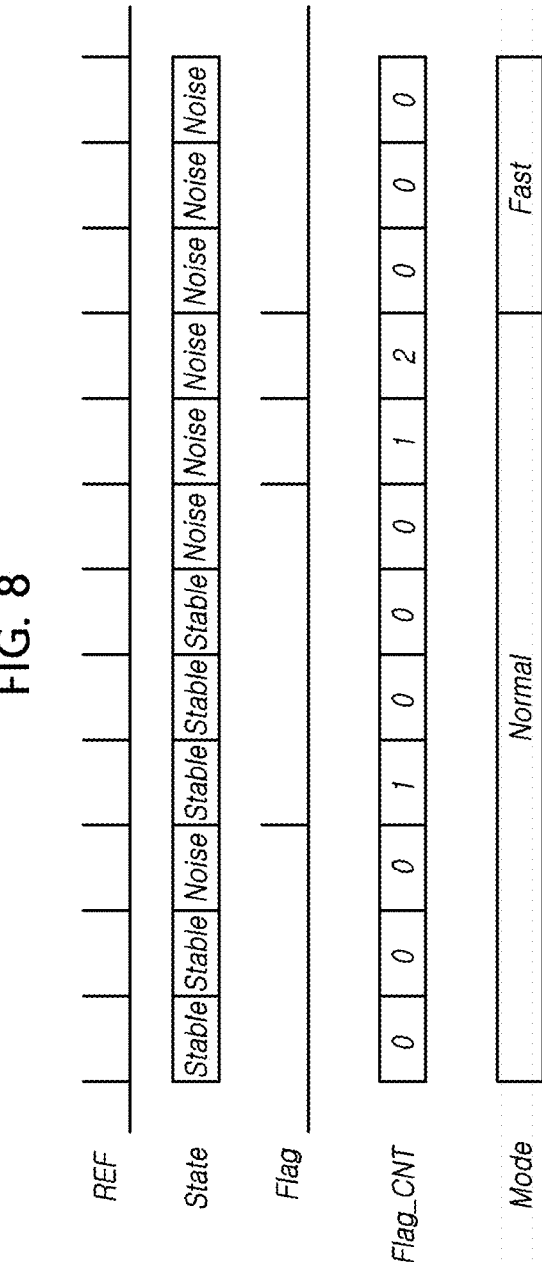

FIG. 8 is a diagram for describing an example of a mode according to a flag and a flag count according to an aspect of the present disclosure.

Figure 9:
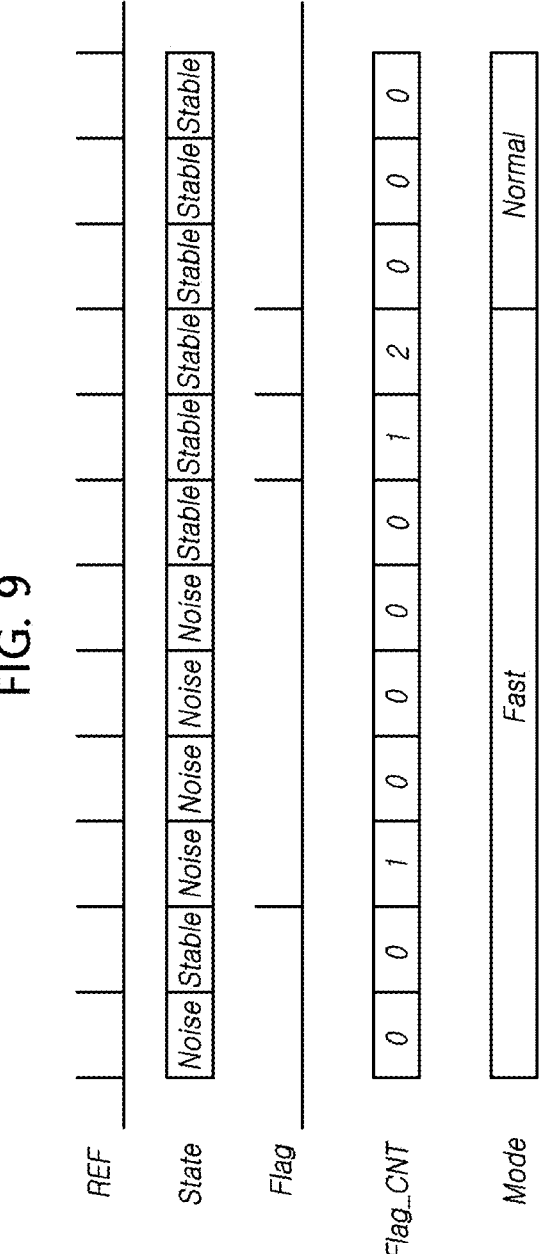

FIG. 9 is a diagram for describing another example of a mode according to a flag and a flag count according to an aspect of the present disclosure.

Figure 10:
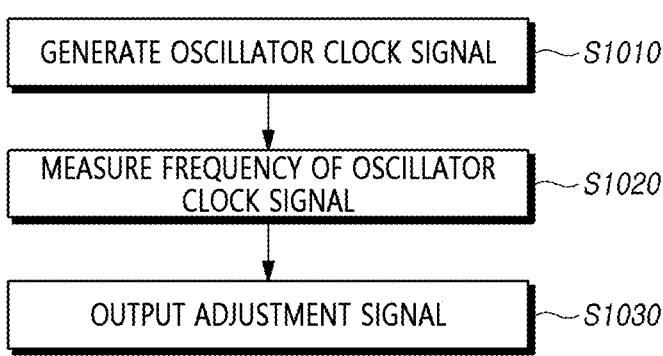

FIG. 10 is a diagram illustrating a frequency correction method for a frequency generator according to another aspect of the present disclosure.

DETAILED DESCRIPTION

Hereinafter, embodiments of the present disclosure will be described in detail with reference to exemplary drawings.

FIG. 1 is a configuration diagram of a display device according to an aspect of the present disclosure.

Referring to FIG. 1, a display device 100 may include a display panel 110 and a display driving circuit that drives the display panel 110.

A plurality of data lines DL and a plurality of gate lines GL may be arranged on the display panel 110, and a plurality of pixels P may be arranged on the display panel 110. Here, the plurality of pixels P may be arranged in a matrix form including a plurality of horizontal lines and a plurality of vertical lines.

The display driving circuit that drives the display panel 110 may include a source driver 120, a gate driver 130, a timing controller 140, and a frequency generator 150.

In the display driving circuit, the gate driver 130 may output a scan signal of a turn-on voltage or a turn-off voltage to the gate line GL. When the scan signal of the turn-on voltage is supplied to the pixel P, the pixel P is connected to the data line DL, and when the scan signal of the turn-off voltage is supplied to the pixel P, the pixel P and the data line DL are disconnected from each other.

In the display driving circuit, the source driver 120 supplies a data voltage to the data line DL. The data voltage supplied to the data line DL is transmitted to the pixel P connected to the data line DL according to the scan signal.

In the display driving circuit, the timing controller 140 may receive a vertical synchronization signal Vsync, a horizontal synchronization signal Hsync, a data enable signal DE, and image data RGB from the host 10. The timing controller 140 may receive an oscillator clock signal OCS_CLK from the frequency generator 150.

Meanwhile, the timing controller 140 may generate a control signal of the gate driver 130 and a control signal of the source driver 120 by using the vertical synchronization signal Vsync, the horizontal synchronization signal Hsync, the data enable signal DE, and the oscillator clock signal OCS_CLK.

First, the timing controller 140 may generate a gate control signal GCS by using the vertical synchronization signal Vsync, the horizontal synchronization signal Hsync, the data enable signal DE, and the oscillator clock signal OCS_CLK and may output the gate control signal to the gate driver 130. Here, the gate control signal GCS may include a gate start pulse (GSP), a gate shift clock (GSC), a gate output enable signal (GOE), and a gate modulation control signal.

The timing controller 140 may convert the image data RGB received from the host 10 into a data format to be used in the source driver 120.

The timing controller 140 may output the converted image data RGB' to the source driver 120.

In addition, the timing controller 140 may generate a data control signal DCS by using the vertical synchronization signal Vsync, the horizontal synchronization signal Hsync, the data enable signal DE, and the oscillator clock signal OCS_CLK and may output the data control signal to the source driver 120.

Here, the data control signal DCS may include a source start pulse (SSP), a source shift clock (SSC), and a source output enable (SOE) signal.

The frequency generator 150 may include an oscillator that outputs the oscillator clock signal OCS_CLK. The oscillator clock signal OCS_CLK may be transmitted to the timing controller 140.

FIG. 2 is a diagram illustrating the frequency generator according to an aspect of the present disclosure.

FIG. 3 is a diagram for describing a frequency measurement period and frequency correction for each mode according to an aspect of the present disclosure.

Referring to FIGS. 2 and 3, the frequency generator 150 may include an oscillator 210 that generates an oscillator clock signal, and a frequency correction circuit 220 that, in a normal mode, measure the frequency of the oscillator clock signal OCS_CLK during a first frequency measurement period FMT1 with a duration of a first unit period UT1, and in a fast mode according to the state of the oscillator clock signal OCS_CLK, measures the frequency of the oscillator clock signal OCS_CLK during a second frequency measurement period FMT2 with a duration of a second unit period UT2 smaller than the first unit period UT1, and outputs, to the oscillator 210, an adjustment signal trim for correcting a frequency deviation between the measured frequency of the oscillator clock signal OCS_CLK and a target frequency.

The oscillator 210 may generate the oscillator clock signal OCS_CLK and transmit the generated oscillator clock signal OCS_CLK to the frequency correction circuit 220. In addition, the oscillator 210 may adjust the frequency of the oscillator clock signal OCS_CLK based on the adjustment signal trim output from the frequency correction circuit 220.

The frequency correction circuit 220 may receive the oscillator clock signal OCS_CLK from the oscillator 210. In addition, the frequency correction circuit 220 may receive the vertical synchronization signal Vsync, the horizontal synchronization signal Hsync, the data enable signal DE, and a real time clock (RTC) signal from the host.

The normal mode is a mode in which the frequency correction circuit 220 measures and corrects the frequency of the oscillator clock signal OCS_CLK during a normal frequency measurement period. When the frequency measurement period is set to be relatively large, a relatively large number of oscillator clock signals OCS_CLK may be counted, thereby increasing the accuracy of the frequency measurement value. In addition, when the frequency correction circuit 220 measures the oscillator clock signal OCS_CLK during a relatively large frequency measurement period, frequency fluctuations occurring in the oscillator clock signal OCS_CLK may be ignored in terms of average.

However, when continuous frequency fluctuations occur in the oscillator clock signal OCS_CLK, the frequency correction circuit 220 is limited to quickly reflecting frequency fluctuations when correcting the frequency of the oscillator clock signal OCS_CLK during the relatively large frequency measurement period.

Meanwhile, as described above, in the fast mode, the frequency correction circuit 220 may measure the frequency of the oscillator clock signal OCS_CLK during the second frequency measurement period FMT2 having the duration of the second unit period UT2 smaller than the first unit period UT1.

The fast mode is a mode in which the frequency of the oscillator clock signal OCS_CLK is corrected by quickly reflecting frequency fluctuations.

When the frequency correction circuit 220 operates in the normal mode to measure and correct the frequency of the oscillator clock signal OCS_CLK during the relatively large frequency measurement period, a quick response to frequency fluctuations is limited. On the other hand, when the frequency correction circuit 220 operates in the fast mode, the frequency correction circuit 220 measures and corrects the frequency of the oscillator clock signal OCS_CLK during a relatively small frequency measurement period. Accordingly, a quick response to a continuously changing frequency is possible.

Meanwhile, the frequency correction circuit 220 may include a counter (not shown) for measuring the frequency of the oscillator clock signal OCS_CLK. The frequency correction circuit 220 may calculate the frequency of the oscillator clock signal OCS_CLK based on the number of toggles of the oscillator clock signal OCS_CLK during the frequency measurement period counted through the counter.

The first unit period UT1 and the second unit period UT2 may be set in accordance with a policy regarding the operation of the frequency generator.

The frequency correction circuit 220 may calculate a frequency deviation between the measured frequency of the oscillator clock signal OCS_CLK and the target frequency and may output, to the oscillator 210, the adjustment signal trim for correcting the frequency deviation.

In this case, as described above, the oscillator 210 may adjust the frequency of the oscillator clock signal OCS_CLK based on the adjustment signal trim. The adjustment signal trim may include a code for increasing or decreasing the frequency of the oscillator clock signal OCS_CLK according to the deviation between the measured frequency of the oscillator clock signal OCS_CLK and the target frequency.

Meanwhile, when the oscillator 210 is initially driven, the frequency correction circuit 220 may receive an initial adjustment signal trim_OTP for outputting the oscillator clock signal OCS_CLK and may transmit the initial adjustment signal trim_OTP to the oscillator 210.

FIG. 4 is a diagram for describing the first unit period and the second unit period according to an aspect of the present disclosure.

Referring to FIG. 4, the first unit period UT1 may be a period in which a reference clock signal REF input from the outside is toggled by a first count, and the second unit period UT2 may be a period in which the reference clock signal REF is toggled by a second count smaller than the first count.

The reference clock signal REF is a signal used as a reference to determine the frequency measurement period for measuring the frequency of the oscillator clock signal OCS_CLK. The reference clock signal REF may be an RTC signal received from the outside. In this case, the RTC signal may be a signal generated through a crystal oscillator.

As illustrated in FIG. 4, the first count is set to 10, and the first unit period UT1, which is the duration of the first frequency measurement period FMT1, is a period in which the reference clock signal REF is toggled 10 times. The frequency correction circuit 220 operating in the normal mode may calculate a frequency by counting the oscillator clock signal OCS_CLK during a period in which the reference clock signal REF is toggled 10 times.

In addition, as illustrated in FIG. 4, the second count is set to 2, and the second unit period UT2, which is the duration of the second frequency measurement period FMT2, is a period in which the reference clock signal REF is toggled twice. The frequency correction circuit 220 operating in the fast mode may calculate a frequency by counting the oscillator clock signal OCS_CLK during a period in which the reference clock signal REF is toggled twice.

FIG. 5 is a diagram for describing a frequency correction timing for each mode according to an aspect of the present disclosure.

Referring to FIG. 5, in the normal mode, when a frequency deviation occurs during the first frequency measurement period FMT1, the frequency correction circuit 220 may correct the frequency of the oscillator clock signal OCS_CLK during an interval Int corresponding to one cycle of the reference clock signal REF and then start a new frequency measurement period, and in the fast mode, when a frequency deviation occurs during the second frequency measurement period FMT2, the frequency correction circuit 220 may correct the frequency of the oscillator clock signal OCS_CLK without an interval Int.

The frequency correction circuit 220 may separately or simultaneously perform the frequency measurement of the oscillator clock signal OCS_CLK and the frequency correction.

A correction synchronization signal Cal_sync of FIG. 5 is a signal indicating a timing at which correction occurs.

The first frequency measurement period FMT1 of FIG. 5 may be a period in which the reference clock signal REF is toggled 10 times, and the frequency correction circuit 220 may measure a frequency by counting the oscillator clock signal OCS_CLK during the first frequency measurement period FMT1. In the normal mode, when the deviation occurs between the measured frequency of the oscillator clock signal OCS_CLK and the target frequency and thus the frequency correction is required, the frequency correction circuit 220 may output, to the oscillator 210, the adjustment signal trim for correcting the oscillator clock signal OCS_CLK during the interval Int corresponding to one cycle of the reference clock signal REF after the frequency measurement is completed. The frequency correction circuit 220 may measure the oscillator clock signal OCS_CLK during the frequency measurement period in which the interval Int is terminated and newly started.

In FIG. 5, in the normal mode, the interval between the continuous correction synchronization signals Cal_snyc is a period in which a total of 11 reference clock signals REF are toggled, which corresponds to the sum of the interval Int and the duration of the first frequency measurement period FMT1.

The frequency correction circuit 220 may operate stably in the normal mode by adding the interval Int for frequency correction between the frequency measurement periods and correcting the oscillator clock signal OCS_CLK.

Meanwhile, the second frequency measurement period FMT2 of FIG. 5 may be a period in which the reference clock signal REF is toggled twice, and the frequency correction circuit 220 may measure a frequency by counting the oscillator clock signal OCS_CLK during the second frequency measurement period FMT2. In the fast mode, when the correction is required due to the deviation between the measured frequency of the oscillator clock signal OCS_CLK and the target frequency, the frequency correction circuit 220 may output the adjustment signal trim for correcting the oscillator clock signal OCS_CLK at the same time as the completion of the frequency measurement. That is, the frequency correction circuit 220 may start a new frequency measurement period and measure the oscillator clock signal OCS_CLK, without adding a separate interval Int.

In the fast mode, the frequency correction circuit 220 may quickly respond to frequency fluctuations of the oscillator clock signal OCS_CLK by correcting the oscillator clock signal OCS_CLK without an interval Int.

FIG. 6 is a diagram for describing switching between respective modes according to an aspect of the present disclosure.

Referring to FIG. 6, the frequency correction circuit 220 may determine the state of the oscillator clock signal OCS_CLK and operate in the normal mode or the fast mode based on the determination result.

The fast mode may be set for when the frequency of the oscillator clock signal OCS_CLK changes due to a continuous noise effect from the outside. To determine either the normal mode or the fast mode, the frequency correction circuit 220 may determine whether the state of the oscillator clock signal OCS_CLK is a noise state or a stable state during a certain period.

In FIG. 6, when the frequency correction circuit 220 operating in the normal mode determines that the state of the oscillator clock signal OCS_CLK is a noise state as long as a TA period, the frequency correction circuit 220 may change from the normal mode to the fast mode and then operate in the fast mode.

Meanwhile, when the frequency correction circuit 220 operating in the fast mode determines that the state of the oscillator clock signal OCS_CLK is a stable state as long as a TB period, the frequency correction circuit 220 may change from the fast mode to the normal mode and then operate in the normal mode.

In this manner, the frequency correction circuit 220 may operate in the normal mode in a normal case, but may switch to the fast mode and operate in the fast mode, based on the state of the oscillator clock signal OCS_CLK due to a continuous noise effect, or may switch from the fast mode to the normal mode in response thereto and operate in the normal state.

FIG. 7 is a diagram for describing determination as to the presence or absence of a noise effect according to an aspect of the present disclosure.

Referring to FIG. 7, the frequency correction circuit 220 may determine the state of the oscillator clock signal based on a count value OCS_CLK_CNT of the oscillator clock signal during one cycle of the reference clock signal REF.

Apart from counting the oscillator clock signal OCS_CLK for measuring the frequency during the first frequency measurement period or the second frequency measurement period, the frequency correction circuit 220 may count the oscillator clock signal OCS_CLK during one cycle of the reference clock signal REF. The frequency correction circuit 220 may determine the noise state or the stable state of the oscillator clock signal OCS_CLK according to the presence or absence of the noise injected from the outside, based on the count value OCS_CLK_CNT of the oscillator clock signal, and may determine whether to operate in the normal mode or the fast mode.

For example, when the count value OCS_CLK_CNT of the oscillator clock signal per cycle of the reference clock signal REF corresponding to the target frequency is 100 and is less than 5% or more than 5%, the frequency correction circuit 220 assumes that the oscillator clock signal OCS_CLK is in a noise state.

In FIG. 7, the count value OCS_CLK_CNT of the oscillator clock signal during one cycle of the first reference clock signal REF is 100, and the frequency correction circuit may determine that the state of the oscillator clock signal OCS_CLK is not a noise state but a stable state.

The count value OCS_CLK_CNT of the oscillator clock signal during one cycle of the next reference clock signal REF is 103, and the frequency correction circuit 220 may determine that the state of the oscillator clock signal OCS_CLK is a stable state as before.

Meanwhile, the count value OCS_CLK_CNT of the oscillator clock signal during one cycle of the third reference clock signal REF is 92, and the frequency correction circuit 220 may determine that the state of the oscillator clock signal OCS_CLK is a noise state.

The frequency correction circuit 220 may determine the normal mode or the fast mode based on the state of the oscillator clock signal OCS_CLK determined during one cycle of the reference clock signal REF by the above-described method.

FIG. 8 is a diagram for describing an example of a mode according to a flag and the number of occurrence of the flag according to an aspect of the present disclosure.

Referring to FIG. 8, in a normal mode, the frequency correction circuit 220 may generate a flag when the state of the oscillator clock signal OCS_CLK is a noise state during one cycle of the reference clock signal REF, and may operate in a fast mode when a flag count Flag_CNT corresponding to the flag is greater than or equal to a third count.

For example, when the third count is set to 3 and the state of the oscillator clock signal OCS_CLK is a noise state during three continuous or intermittent cycles of the reference clock signal REF, the frequency correction circuit 220 may change from the normal mode to the fast mode and operate in the fast mode.

Meanwhile, the frequency correction circuit 220 may initialize the flag count Flag_CNT when the flag is not continuous.

In FIG. 8, when it is assumed that frequency fluctuations occur in a portion of the oscillator clock signal OCS_CLK in a stable state corresponding to the cycle of the third reference clock signal REF, the frequency correction circuit 220 may determine that the state is a noise state and may generate the flag. However, since the oscillator clock signal OCS_CLK is determined to be in a stable state in the subsequent reference clock signal REF, the flag count Flag_CNT may be initialized.

Thereafter, when the flag occurs three times in succession in the seventh to ninth times of the reference clock signal REF, the frequency correction circuit 220 may change from the normal mode to the fast mode and operate in the fast mode. As the mode is changed, the frequency correction circuit 220 may initialize the flag count Flag_CNT.

Accordingly, the frequency correction circuit 220 may distinguish between temporary noise and continuous noise and may change to the fast mode and operate in the fast mode only in the case of continuous noise.

FIG. 9 is a diagram for describing another example of a mode according to a flag and a flag count according to an aspect of the present disclosure.

Referring to FIG. 9, in a fast mode, the frequency correction circuit 220 may generate a flag when the state of the oscillator clock signal OCS_CLK is a stable state during one cycle of the reference clock signal REF, and may operate in a normal mode when a flag count Flag_CNT corresponding to the flag is greater than or equal to a fourth count.

For example, when the fourth count is set to 3 and the state of the oscillator clock signal OCS_CLK is a stable state during three continuous or intermittent cycles of the reference clock signal REF, the frequency correction circuit 220 may change from the fast mode to the normal mode and operate in the normal mode.

Meanwhile, the frequency correction circuit 220 may initialize the flag count Flag_CNT when the flag is not continuous by the fourth count.

In FIG. 9, when it is assumed that frequency fluctuations do not occur in a portion of the oscillator clock signal OCS_CLK in a noise state corresponding to the cycle of the second reference clock signal REF, the frequency correction circuit 220 may determine that the state is a stable state and may generate the flag. However, since the oscillator clock signal OCS_CLK is determined to be in a noise state in the subsequent reference clock signal REF, the flag count Flag_CNT may be initialized.

Thereafter, when the flag occurs three times in succession in the seventh to ninth times of the reference clock signal REF, the frequency correction circuit 220 may change from the fast mode to the normal mode and operate in the normal mode. As the mode is changed, the frequency correction circuit 220 may initialize the flag count Flag_CNT.

Accordingly, the frequency correction circuit 220 may distinguish between a temporary stable state and a continuous stable state and may change to the normal mode and operate in the normal mode only when the continuous stable state is maintained.

FIG. 10 is a diagram illustrating a frequency correction method for a frequency generator according to another aspect of the present disclosure.

Referring to FIG. 10, the frequency correction method for the frequency generator 150 may include operation S1010 of generating the oscillator clock signal OCS_CLK.

In addition, the frequency correction method for the frequency generator 150 may include operation S1020 of measuring the frequency of the oscillator clock signal OCS_CLK in either the normal mode corresponding to the first frequency measurement period with the duration of the first unit period or the fast mode corresponding to the second frequency measurement period with the duration of the second unit period smaller than the first unit period.

In this case, the first unit period may be a period in which the reference clock signal is toggled by the first count, and the second unit period may be a period in which the reference clock signal is toggled by the second count smaller than the first count.

In addition, the frequency correction method for the frequency generator 150 may include operation S1030 of outputting the adjustment signal for correcting the frequency deviation between the measured frequency of the oscillator clock signal OCS_CLK and the target frequency.

In this case, in operation S1030 of outputting the adjustment signal, in the normal mode, the adjustment signal trim for correcting the frequency of the oscillator clock signal OCS_CLK may be output during the interval Int corresponding to one cycle of the reference clock signal REF, and in the fast mode, the adjustment signal trim for correcting the frequency of the oscillator clock signal OCS_CLK may be output without an interval Int.

Meanwhile, the frequency correction method for the frequency generator 150 may further include operation of determining the state of the oscillator clock signal OCS_CLK and may determine the normal mode or the fast mode based on the determination result.

Meanwhile, in operation of determining the state of the oscillator clock signal, the frequency correction method for the frequency generator 150 may count the count value OCS_CLK_CNT of the oscillator clock signal during one cycle of the reference clock signal REF and determine the state of the oscillator clock signal OCS_CLK based on the count value OCS_CLK_CNT of the oscillator clock signal.

In this case, the frequency correction method for the frequency generator 150 may further include operation of generating the flag when the state of the oscillator clock signal OCS_CLK is the noise state in the normal mode, and operation of changing to the fast mode when the flag count Flag_CNT corresponding to the flag is greater than or equal to the third count.

In this case, the frequency correction method for the frequency generator may initialize the flag count Flag_CNT when the flag is not continuous.

Meanwhile, the frequency correction method for the frequency generator 150 may further include operation of generating the flag when the state of the oscillator clock signal OCS_CLK is the stable state in the fast mode, and operation of changing to the fast mode when the flag count Flag_CNT corresponding to the flag is greater than or equal to the fourth count.

In this case, the frequency correction method for the frequency generator may initialize the flag count Flag_CNT when the flag is not continuous.

It will be apparent to those skilled in the art that various modifications and variations can be made in the present disclosure without departing from the spirit or scope of the aspects of the present disclosure. Thus, it is intended that the present disclosure covers the modifications and variations of the aspects provided they come within the scope of the appended claims and their equivalents.

The invention claimed is:

1. A frequency generator comprising:
an oscillator that generates an oscillator clock signal; and
a frequency correction circuit that selectively operates in one of a normal mode and a fast mode with different correction periods according to a state of the oscillator clock signal,
wherein the frequency correction circuit generates a flag when the state of the oscillator clock signal during one cycle of the reference clock signal is a noise state in the normal mode, and operates in the fast mode when a flag count corresponding to the flag is greater than or equal to a first count.

2. The frequency generator of claim 1, wherein the frequency generator measures a frequency of the oscillator clock signal during a first period in the normal mode, measure the frequency of the oscillator clock signal during a second period shorter than the first period in the fast mode, and outputs, to the oscillator, an adjustment signal for correcting a frequency deviation between the measured frequency of the oscillator clock signal and a target frequency.

3. The frequency generator of claim 2, wherein, when the frequency deviation occurs in the normal mode, the frequency correction circuit corrects the frequency of the oscillator clock signal during a preset interval and then starts measuring a new frequency, and when the frequency deviation occurs in the fast mode, the frequency correction circuit corrects the frequency of the oscillator clock signal without the interval.

4. The frequency generator of claim 2, wherein the first period is a period in which a reference clock signal input from an outside is toggled by a second count, and wherein the second period is a period in which the reference clock signal is toggled by a third count smaller than the second count.

5. The frequency generator of claim 4, wherein the frequency correction circuit determines the state of the oscillator clock signal based on a count value of the oscillator clock signal during one cycle of the reference clock signal.

6. The frequency generator of claim 5, wherein the frequency correction circuit generates a flag when the state of the oscillator clock signal during one cycle of the reference clock signal is a stable state in the fast mode, and operates in the normal mode when a flag count corresponding to the flag is greater than or equal to a fourth count.

7. The frequency generator of claim 6, wherein the frequency correction circuit initializes the flag count when the flag is not continuous.

8. The frequency generator of claim 1, wherein the frequency correction circuit initializes the flag count when the flag is not continuous.

9. The frequency generator of claim 1, wherein the frequency correction circuit further comprises a counter that measures a frequency of the oscillator clock signal.

10. The frequency generator of claim 9, wherein the frequency correction circuit calculates the frequency of the oscillator clock signal based on a number of toggles of the oscillator clock signal during a frequency measurement period counted through the counter.

11. A frequency correction method for correcting a frequency of an oscillator in a frequency generator, the frequency correction method comprising:

generating an oscillator clock signal; and measuring a frequency of the oscillator clock signal in one of a normal mode and a fast mode with different correction periods according to a state of the oscillator clock signal, generating a flag in the normal mode when the state of the oscillator clock signal is a noise state; and changing to the fast mode when a flag count corresponding to the flag is greater than or equal to a first count.

12. The frequency correction method of claim 11, wherein the measuring of the frequency of the oscillator clock signal comprises measuring the frequency of the oscillator clock signal during a first period in the normal mode, and measuring the frequency of the oscillator clock signal during a second period shorter than the first period in the fast mode.

13. The frequency correction method of claim 12, further comprising outputting an adjustment signal for correcting a frequency deviation between the measured frequency of the oscillator clock signal and a target frequency, wherein the outputting of the adjustment signal comprises outputting the adjustment signal for correcting the frequency of the oscillator clock signal during a preset interval in the normal mode, and outputting the adjustment signal for correcting the frequency of the oscillator clock signal without the interval in the fast mode.

14. The frequency correction method of claim 13, further comprising determining the state of the oscillator clock signal, wherein the normal mode or the fast mode is determined based on the determination result.

15. The frequency correction method of claim 14, wherein the first period is a period in which a reference clock signal input from an outside is toggled by a second count, wherein the second period is a period in which the reference clock signal is toggled by a third count smaller than the second count, and wherein the determining of the state of the oscillator clock signal comprises counting a count value of the oscillator clock signal during one cycle of the reference clock signal, and determining the state of the oscillator clock signal based on the count value of the oscillator clock signal.

16. The frequency correction method of claim 15, further comprising:

generating a flag in the fast mode when the state of the oscillator clock signal is stable; and changing to the normal mode when a flag count corresponding to the flag is greater than or equal to a fourth count.

17. The frequency correction method of claim 16, wherein the flag count is initialized when the flag is not continuous.

18. The frequency correction method of claim 11, wherein the flag count is initialized when the flag is not continuous.

\* \* \* \* \*